United States Patent
Tan et al.

(10) Patent No.: US 7,821,318 B1
(45) Date of Patent: Oct. 26, 2010

(54) WIRELESS TRANSCEIVER COMPONENTS WITH IMPROVED IQ MATCHING

(75) Inventors: Chun Geik Tan, Singapore (SG); Naratip Wongkomet, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 184 days.

(21) Appl. No.: 12/156,507

(22) Filed: Jun. 2, 2008

Related U.S. Application Data

(62) Division of application No. 11/701,036, filed on Feb. 1, 2007, now Pat. No. 7,518,417.

(60) Provisional application No. 60/797,549, filed on May 4, 2006.

(51) Int. Cl.
*G06G 7/44* (2006.01)
(52) U.S. Cl. .............................. 327/359; 377/47; 377/48
(58) Field of Classification Search ................. 327/115, 327/117, 359; 377/47, 48
See application file for complete search history.

(56) References Cited

U.S. PATENT DOCUMENTS

| 7,289,783 | B2 | 10/2007 | Rostami et al. |
| 7,403,048 | B2 | 7/2008 | Heidari et al. |
| 7,518,417 | B1 * | 4/2009 | Tan et al. ..................... 327/115 |

* cited by examiner

*Primary Examiner*—Kenneth B. Wells

(57) ABSTRACT

A mixer includes first and second differential input pairs that include first and second transistors. First and second bias transistors receive a first signal of a differential input signal that is the one of a first phase and a second phase, and that respectively communicate with first terminals of the first and second transistors of the first differential input pair. Third and fourth bias transistors receive a second signal of the differential input signal, and that respectively communicate with first terminals of the first and second transistors of the second differential input pair. First and second capacitive elements have first and second ends that respectively communicate with the first terminals of the first and second transistors of the first and second differential input pairs. Four current sourcing elements respectively communicate with first terminals of the first, second, third, and fourth bias transistors.

10 Claims, 11 Drawing Sheets

WIRELESS TRANSCEIVER COMPONENTS WITH IMPROVED IQ MATCHING

CROSS-REFERENCE TO RELATED APPLICATIONS

This application is a divisional of U.S. patent application Ser. No. 11/701,036, filed Feb. 1, 2007, now U.S. Pat. No. 7,518,417, issued Apr. 14, 2009, which claims the benefit of U.S. Provisional Application No. 60/797,549, filed May 4, 2006. The disclosures of the above applications are incorporated herein by reference in their entirety.

FIELD

The present disclosure relates to improving IQ matching in wireless transceiver components, and more specifically to correcting for transistor mismatch in wireless transceiver components.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional block diagram of a wireless system 100 according to the prior art is presented. The wireless system 100 includes an antenna 102, a transceiver 104, and a baseband processor 106. The transceiver 104 includes a duplexer 108, which communicates with the antenna 102. The duplexer 108 communicates with a first filter 110 and a power amplifier 112. The first filter 110 applies a frequency profile to data received from the duplexer 108, and communicates filtered data to a low noise amplifier (LNA) 114.

The LNA 114 communicates an amplified output to a second filter 116. The second filter 116 communicates a filtered output to first and second mixers 118-1 and 118-2. A local oscillator (LO) 120 generates a local oscillator signal, $LO_G$, which is communicated to a frequency divider 122. The frequency divider 122 phase-shifts the incoming $LO_G$ signals into quadrature and in-phase signals, $LO_Q$ and $LO_I$, respectively. $LO_Q$ and $LO_I$ are separated by 90°, and may both have a frequency that is half of the incoming $LO_G$ frequency.

The frequency divider 122 communicates $LO_Q$ and $LO_I$ to the first and second mixers 118-1 and 118-2 and to third and fourth mixers 124-1 and 124-2. The first mixer 118-1 mixes the output of the second filter 116 with the $LO_Q$ signal, and outputs the result to a third filter 126. The second mixer 118-2 mixes the output of the second filter 116 with the $LO_I$ signal, and communicates the result to a fourth filter 128. The third and fourth filters 126 and 128 communicate outputs to first and second baseband amplifiers 130 and 132, respectively.

Outputs of the first and second baseband amplifiers 130 and 132 are communicated to the baseband processor 106. The baseband processor 106 communicates information to third and fourth baseband amplifiers 140 and 142. The third and fourth baseband amplifiers 140 and 142 communicate outputs to fifth and sixth filters 144 and 146, respectively. Outputs of the fifth and sixth filters 144 and 146 are labeled baseband in-phase, $BB_I$, and baseband quadrature, $BB_Q$, respectively.

The third mixer 124-1 mixes $BB_I$ with $LO_I$, generating an in-phase radio frequency (RF) signal, $RF_I$. The fourth mixer 124-2 mixes $BB_Q$ with $LO_Q$, generating a quadrature signal, $RF_Q$. The third and fourth mixers 124-1 and 124-2 communicate $RF_I$ and $RF_Q$, respectively, to an RF amplifier 148. An amplified output of the RF amplifier 148 is communicated to a seventh filter 150, whose output is communicated to the power amplifier 112.

Referring now to FIG. 2, a functional schematic of a frequency divider 200, such as the frequency divider 122 of FIG. 1, according to the prior art is presented. A differential signal $LO_G$, consisting of a positive signal $LO_G^+$ 202 and a negative signal $LO_G^-$ 204, is received. The frequency divider 200 includes first, second, third, fourth, fifth, sixth, seventh, eighth, ninth, tenth, eleventh, and twelfth transistors 206, 208, 210, 212, 214, 216, 218, 220, 222, 224, 226, and 228.

In various implementations, the first, second, third, fourth, fifth, sixth, seventh, eighth, ninth, tenth, eleventh, and twelfth transistors 206, 208, 210, 212, 214, 216, 218, 220, 222, 224, 226, and 228 are metal oxide semiconductor field effect transistors (MOSFETs) that have gates, sources, and drains, although other transistor types may be used. The positive signal $LO_G^+$ 202 is communicated to the gates of the first and second transistors 206 and 208. The sources of the first and third transistors 206 and 210 communicate with a first terminal of a first resistance 230.

An opposite terminal of the first resistance 230 communicates with ground. The sources of the second and forth transistors 208 and 212 communicate with a first terminal of a second resistance 232. An opposite terminal of the second resistance 232 communicates with ground. The first and second resistances 230 and 232 have a resistance value approximately equal to a value $R_1$. The sources of the fifth and sixth transistors 214 and 216 communicate with the drain of the first transistor 206. The sources of the seventh and eighth transistors 218 and 220 communicate with the drain of the third transistor 210.

The sources of the ninth and tenth transistors 222 and 224 communicate with the drain of the second transistor 208. The sources of the eleventh and twelfth transistors 226 and 228 communicate with the drain of the fourth transistor 212. The drains of the fifth and seventh transistors 214 and 218 and the gate of the eighth transistor 220 communicate with a first terminal of a third resistance 236. The drains of the sixth and eighth transistors 216 and 220 and the gate of the seventh transistor 218 communicate with a first terminal of a fourth resistance 238.

The drains of the ninth and eleventh transistors 222 and 226 and the gate of the tenth transistor 224 communicate with a first terminal of a fifth resistance 240. The drains of the tenth and twelfth transistors 224 and 228 and the gate of the ninth transistor 222 communicate with a first terminal of a sixth resistance 242. Opposite ends of the third, fourth, fifth, and sixth resistances 236, 238, 240, and 242 communicate with a supply potential, such as $V_{DD}$.

The gate of the fifth transistor 214 communicates with the drain of the twelfth transistor 228 and is output from the frequency divider 200 as $LO_I^+$ 250. The gate of the sixth transistor 216 communicates with the drain of the eleventh transistor 226, and is output from the frequency divider 200 as $LO_I^-$ 252. The gate of the eleventh transistor 226 communicates with the drain of the fifth transistor 214, and is output from the frequency divider 200 as $LO_Q^-$ 254. The gate of the twelfth transistor 228 communicates with the drain of the sixth transistor 216, and is output from the frequency divider 200 as $LO_G^+$ 256.

Even when the two signals $LO_G^+$ 202 and $LO_G^-$ 204 of the differential signal are equal, mismatches between the first and third transistors 206 and 210 cause different amounts of current to flow through the first and third transistors 206 and 210. The mismatch between the first and third transistors 206 and 210 can be modeled as an offset voltage ($V_{OS}$) source 260 interposed between the positive signal $LO_G^+$ 202 and the gate of the first transistor 206.

Mismatch between the second and fourth transistors 208 and 212 can be modeled as a second offset voltage source (not shown) between the positive signal $LO_G^+$ 202 and the gate of the second transistor 208. The second offset voltage source can be incorporated into the $V_{OS}$ source 260. These transistor mismatches translate into amplitude and phase mismatches in the output $LO_Q$ and $LO_I$ signals. Amplitude matching may be improved through the use of limiters following the frequency divider 200, but phase matching is much more difficult to restore once a mismatch has been introduced.

The resulting difference in currents between the first and third transistors 206 and 210 (input pair) can be described by the following equation:

$$\Delta I_{DC} = I_{1Q} - I_{2Q} \approx g_m \cdot V_{OS},$$

where $g_m$ is the small signal transconductance of the input pair with an offset voltage $V_{OS}$ equal to zero, and $I_{1Q}$ and $I_{2Q}$ are the currents flowing through the first and third transistors 206 and 210, respectively. The current imbalance $\Delta I_{DC}$ causes the zero crossing instant to shift in time and gives rise to IQ phase mismatch.

Referring now to FIG. 3, a functional schematic of a mixer 300 according to the prior art, such as the first, second, third, or fourth mixers 118-1, 118-2, 124-1, or 124-2 of FIG. 1, is presented. The mixer 300 includes first, second, third, fourth, fifth, and sixth transistors 302, 304, 306, 308, 310, and 312. In various implementations, the first, second, third, fourth, fifth, and sixth transistors 302, 304, 306, 308, 310, and 312 are metal oxide semiconductor field effect transistors (MOSFETs) that have gates, sources, and drains, although other transistor types may be used.

A positive signal of the local oscillator input, $LO_I^+$ 314, is received by the gates of the first and second transistors 302 and 304. The negative signal of the local oscillator input, $LO_I^-$ 316, communicates with the gates of the third and fourth transistors 306 and 308. The positive signal of the in-phase baseband signal, $BB_I^+$ 318, communicates with the gate of the fifth transistor 310.

The negative signal of the in-phase baseband signal, $BB_I^-$ 320, communicates with the gate of the sixth transistor 312. The sources of the fifth and sixth transistors 310 and 312 communicate with first terminals of first and second resistances 322 and 324, respectively. Opposite terminals of the first and second resistances 322 and 324 communicate with ground. The resistance values of the first and second resistances 322 and 324 are approximately equal to a value $R_1$.

The drains of the first and fourth transistors 302 and 308 communicate with a first terminal of a third resistance 326, and also output a negative signal of the in-phase RF signal, $RF_I^-$ 330. The drains of the second and third transistors 304 and 306 communicate with a first terminal of a fourth resistance 328, and also output a positive signal of the in-phase RF signal, $RF_I^+$ 332. Opposite terminals of the third and fourth resistances 326 and 328 communicate with a supply potential, such as $V_{DD}$. Mismatch between the first and third transistors 302 and 306, and between the second and fourth transistors 304 and 308, cause amplitude and phase mismatch in the $RF_I$ signal.

SUMMARY

A frequency divider comprises a first differential input pair, a second differential input pair, a first capacitive element having first and second ends, a second capacitive element having first and second ends, and four current sourcing elements. The first differential input pair includes first and second transistors, each having a control terminal that respectively receives first and second signals of a differential local oscillator signal. The second differential input pair includes first and second transistors, each having a control terminal that respectively receives the first and second signals of the differential local oscillator signal.

The first capacitive element includes first and second ends that respectively communicate with first terminals of the first and second transistors of the first differential input pair. The second capacitive element includes first and second ends that respectively communicate with first terminals of the first and second transistors of the second differential input pair. The four current sourcing elements respectively communicate with the first terminals of the first and second transistors of the first and second differential input pairs.

In other features, the transistors of the first and second differential input pairs are metal oxide semiconductor field effect transistors (MOSFETs), which each have a source, a drain, and a gate. The source serves as the first terminal, the drain serves as the second terminal, and the gate serves as the control terminal. The four current sourcing elements comprise resistors. The four current sourcing elements also communicate with a ground potential. The four current sourcing elements comprise current sources.

In further features, the frequency divider further comprises a circuit that communicates with second terminals of the first and second transistors of the first and second differential input pairs, and that outputs first and second signals of a differential first phase signal and first and second signals of a differential second phase signal. The differential first phase signal and the differential second phase signal have a phase difference of ninety degrees. Each of the differential first phase signal and the differential second phase signal are one of in-phase and quadrature.

In still other features, the differential local oscillator signal has a first frequency, the differential first phase signal and the differential second phase signal have a second frequency, and the second frequency is one half of the first frequency. A wireless transceiver comprises the frequency divider and further comprises a first mixer that receives the differential first phase signal and a second mixer that receives the differential second phase signal.

A mixer comprises a first differential input pair, a second differential input pair, first and second bias transistors, third and fourth bias transistors, a first capacitive element having first and second ends, a second capacitive element having first and second ends, and four current sourcing elements. The first differential input pair includes first and second transistors, each having a control terminal that respectively receives first and second signals of a differential oscillator signal that is one of a first phase and a second phase.

The second differential input pair includes first and second transistors, each having a control terminal that respectively receives the first and second signals of the differential oscillator signal. First and second bias transistors receive a first signal of a differential input signal that is the one of the first phase and the second phase, and that respectively communicate with first terminals of the first and second transistors of the first differential input pair. Third and fourth bias transistors receive a second signal of the differential input signal and respectively communicate with first terminals of the first and second transistors of the second differential input pair.

The first capacitive element includes first and second ends that respectively communicate with the first terminals of the first and second transistors of the first differential input pair. The second capacitive element includes first and second ends that respectively communicate with the first terminals of the first and second transistors of the second differential input pair. Four current sourcing elements respectively communicate with first terminals of the first, second, third, and fourth bias transistors.

In other features, second terminals of the first transistors of the first and second differential input pairs communicate together to output a first signal of a differential output signal that is the one of the first phase and the second phase. The second terminals of the second transistors of the first and second differential input pairs communicate together to output a second signal of the differential output signal. The second terminals of the first transistors of the first and second differential input pairs communicate with a first loading device. The second terminals of the second transistors of the first and second differential input pairs communicate with a second loading device.

In further features, the first and second loading devices comprise resistors that communicate with a supply potential. The first and second transistors of the first and second differential input pairs and the first, second, third, and fourth bias transistors are metal oxide semiconductor field effect transistors (MOSFETs), which each have a source, a drain, and a gate. The source serves as the first terminal, the drain serves as the second terminal, and the gate serves as the control terminal.

In still other features, the four current sourcing elements comprise resistors. The four current sourcing elements communicate with a ground potential. The four current sourcing elements comprise current sources. The first phase and the second phase comprise in-phase and quadrature, respectively. A wireless transceiver comprises the mixer and further comprises a frequency divider that provides the differential oscillator signal.

A frequency divider comprises first inputting means, second inputting means, first capacitive means, second capacitive means, and four current sourcing means. The first inputting means is for receiving a differential signal and includes first and second amplifying means for amplifying first and second signals of a differential local oscillator signal received at respective first and second control terminals of the first and second amplifying means, respectively.

The second inputting means is for receiving a differential signal and includes first and second amplifying means for amplifying the first and second signals of the differential local oscillator signal received at respective first and second control terminals of the first and second amplifying means, respectively. The first capacitive means is for providing capacitance between first terminals of the first and second amplifying means of the first inputting means.

The second capacitive means is for providing capacitance between first terminals of the first and second amplifying means of the second inputting means. The four current sourcing means are for respectively sourcing current from the first terminals of the first and second amplifying means of the first and second inputting means.

In other features, the amplifying means of the first and second inputting means comprise metal oxide semiconductor field effect transistors (MOSFETs), which each have a source, a drain, and a gate. The source serves as the first terminal, the drain serves as the second terminal, and the gate serves as the control terminal. The four current sourcing means comprise resistors. The four current sourcing means also communicate with a ground potential.

In further features, the four current sourcing means comprise current sources. The frequency divider further comprises a circuit that communicates with second terminals of the first and second amplifying means of the first and second inputting means, and that outputs first and second signals of a differential first phase signal and first and second signals of a differential second phase signal. The differential first phase signal and the differential second phase signal have a phase difference of ninety degrees.

In still other features, each of the differential first phase signal and the differential second phase signal are one of in-phase and quadrature. The differential local oscillator signal has a first frequency, the differential first phase signal and the differential second phase signal have a second frequency, and the second frequency is one half of the first frequency. A wireless transceiver comprises the frequency divider and further comprises first mixing means for mixing multiple input signals and that receives the differential first phase signal; and second mixing means for mixing multiple input signals and that receives the differential second phase signal.

A mixer comprises first inputting means, second inputting means, first and second input amplifying means, third and fourth input amplifying means, first capacitive means, second capacitive means, and four current sourcing means. The first inputting means is for receiving a differential signal and includes first and second amplifying means for amplifying first and second signals of a differential local oscillator signal received at respective first and second control terminals of the first and second amplifying means, respectively.

The differential oscillator signal is one of a first phase and a second phase. The second inputting means is for receiving a differential signal and includes first and second amplifying means for amplifying the first and second signals of the differential local oscillator signal received at respective first and second control terminals of the first and second amplifying means, respectively. The first and second input amplifying means are for amplifying a first signal of a differential input signal that is the one of the first phase and the second phase and respectively communicate with first terminals of the first and second amplifying means of the first inputting means.

The third and fourth input amplifying means are for amplifying a second signal of the differential input signal and that respectively communicate with first terminals of the first and second amplifying means of the second inputting means. The first capacitive means is for providing capacitance between the first terminals of the first and second amplifying means of the first inputting means. The second capacitive means is for providing capacitance between the first terminals of the first and second amplifying means of the second inputting means. The four current sourcing means are for respectively sourcing current from first terminals of the first, second, third, and fourth input amplifying means.

In other features, second terminals of the first amplifying means of the first and second inputting means communicate together to output a first signal of a differential output signal that is the one of the first phase and the second phase. The second terminals of the second amplifying means of the first and second inputting means communicate together to output a second signal of the differential output signal. The second terminals of the first amplifying means of the first and second inputting means communicate with a first loading device. The second terminals of the second amplifying means of the first and second inputting means communicate with a second loading device.

In further features, the first and second loading devices comprise resistors that communicate with a supply potential. The first and second amplifying means of the first and second inputting means and the first, second, third, and fourth input amplifying means are metal oxide semiconductor field effect transistors (MOSFETs), which each have a source, a drain, and a gate. The source serves as the first terminal, the drain serves as the second terminal, and the gate serves as the control terminal.

In still other features, the four current sourcing means comprise resistors. The four current sourcing means communicate with a ground potential. The four current sourcing means comprise current sources. The first phase and the second phase comprise in-phase and quadrature, respectively. A wireless transceiver comprises the mixer and further comprises frequency dividing means for providing the differential oscillator signal.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
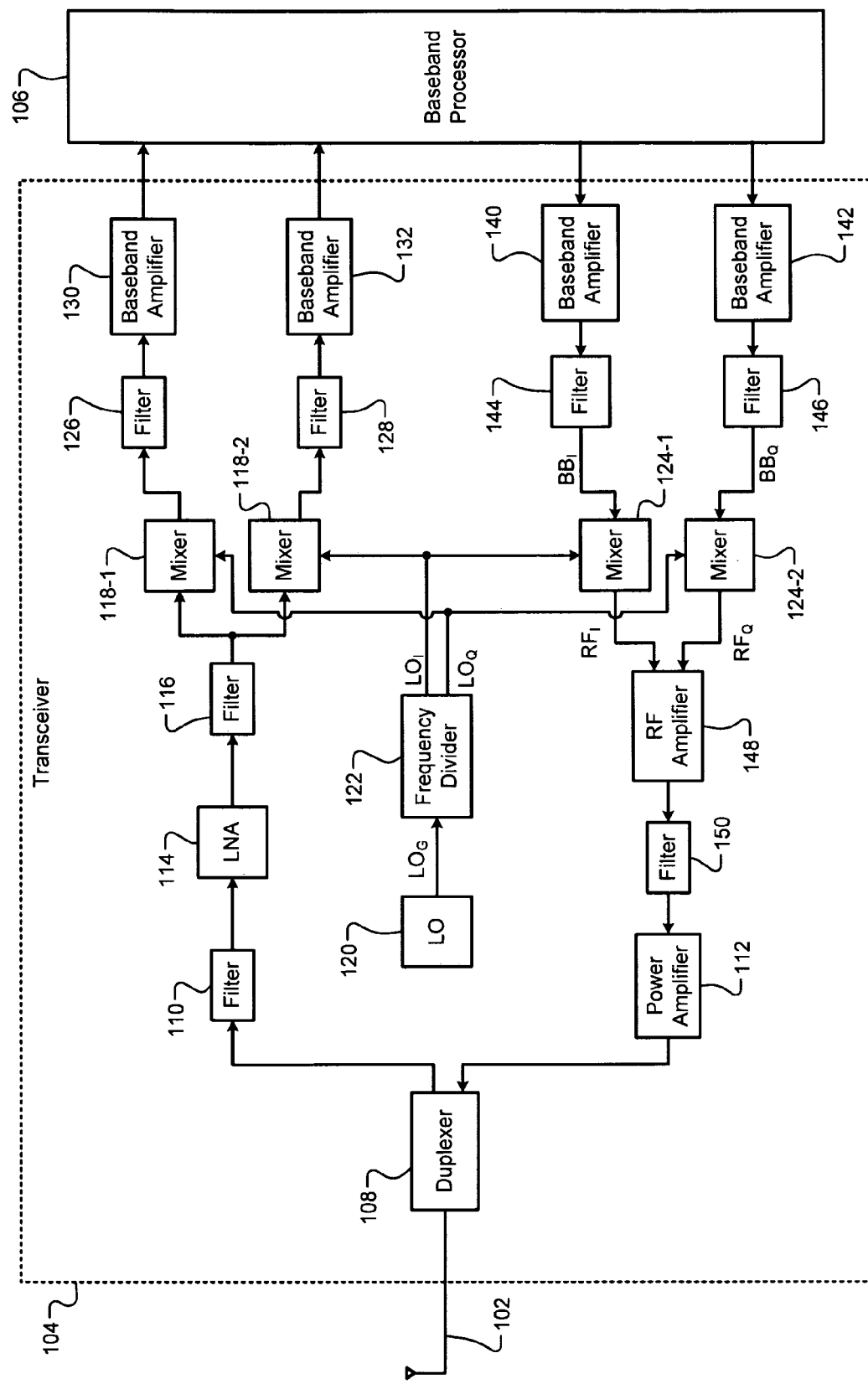
FIG. 1 is a functional block diagram of a wireless system according to the prior art.

The following description is merely exemplary in nature and is in no way intended to limit the disclosure, its application, or uses. For purposes of clarity, the same reference numbers will be used in the drawings to identify similar elements. As used herein, the term module, circuit, and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 4:
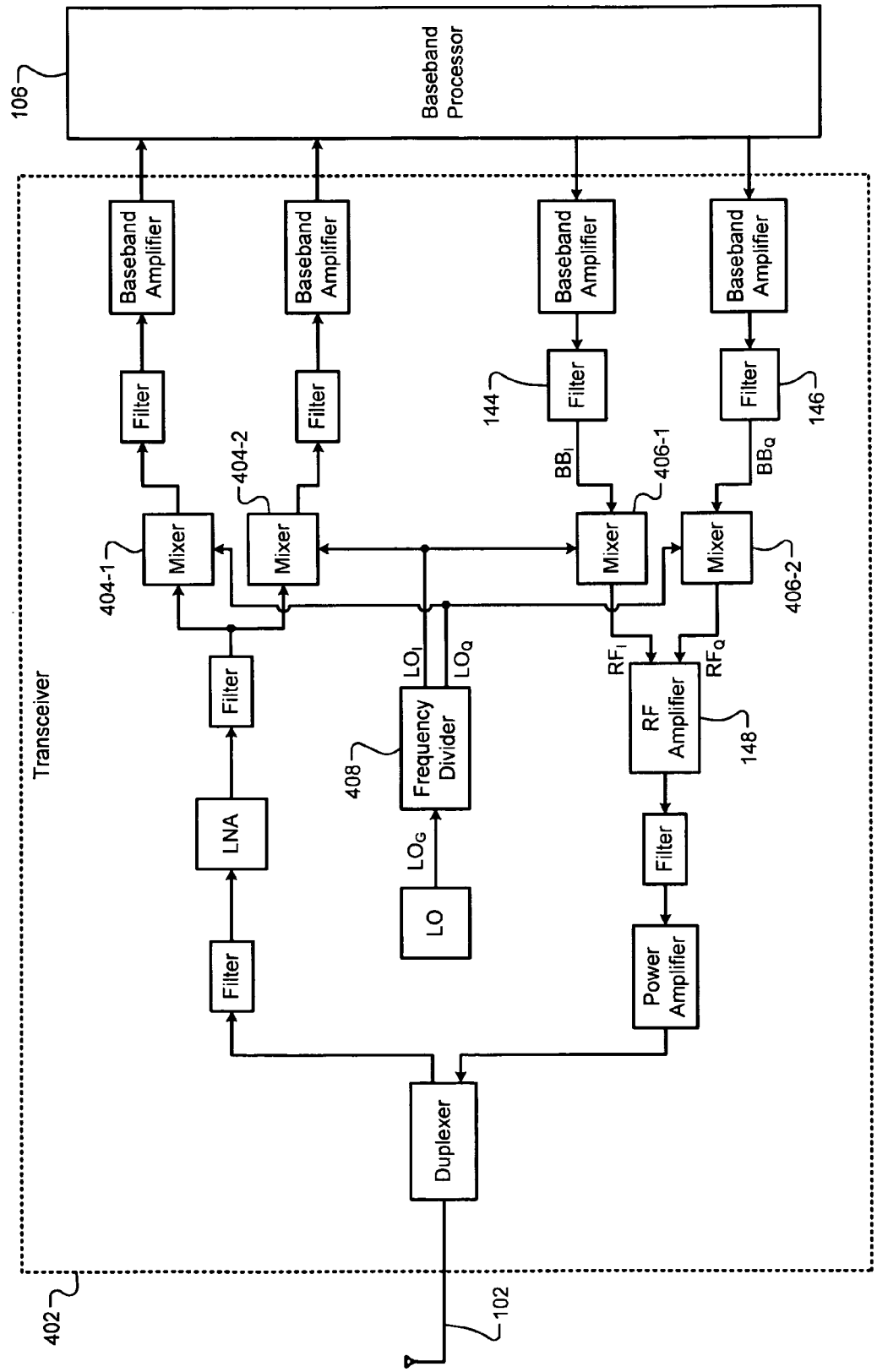
FIG. 4 is a functional block diagram of an exemplary wireless system according to the principles of the present disclosure.

Referring now to FIG. 4, a functional block diagram of an exemplary wireless system 400 according to the principles of the present disclosure is presented. For purposes of clarity, reference numerals from FIG. 1 are used to indicate similar components. The wireless system 400 includes an antenna 102, a transceiver 402, and a baseband processor 106. The transceiver 402 includes a first mixer 404-1, a second mixer 404-2, a third mixer 406-1, a fourth mixer 406-2, and a frequency divider 408. The third and fourth mixers 406-1 and 406-2 receive $BB_I$ and $BB_Q$ signals from first and second filters 144 and 146, respectively.

The frequency divider 408 provides a $LO_Q$ signal to the first and fourth mixers 404-1 and 406-2 and a $LO_I$ signal to the second and third mixers 404-2 and 406-1. The third mixer 406-1 mixes the BB, signal with the $LO_I$ signal to create an $RF_I$ signal, which is communicated to an RF amplifier 148. The fourth mixer 406-2 mixes the $BB_Q$ signal with the $LO_Q$ signal to create an $RF_Q$ signal, which is communicated to the RF amplifier 148.

Figure 2:
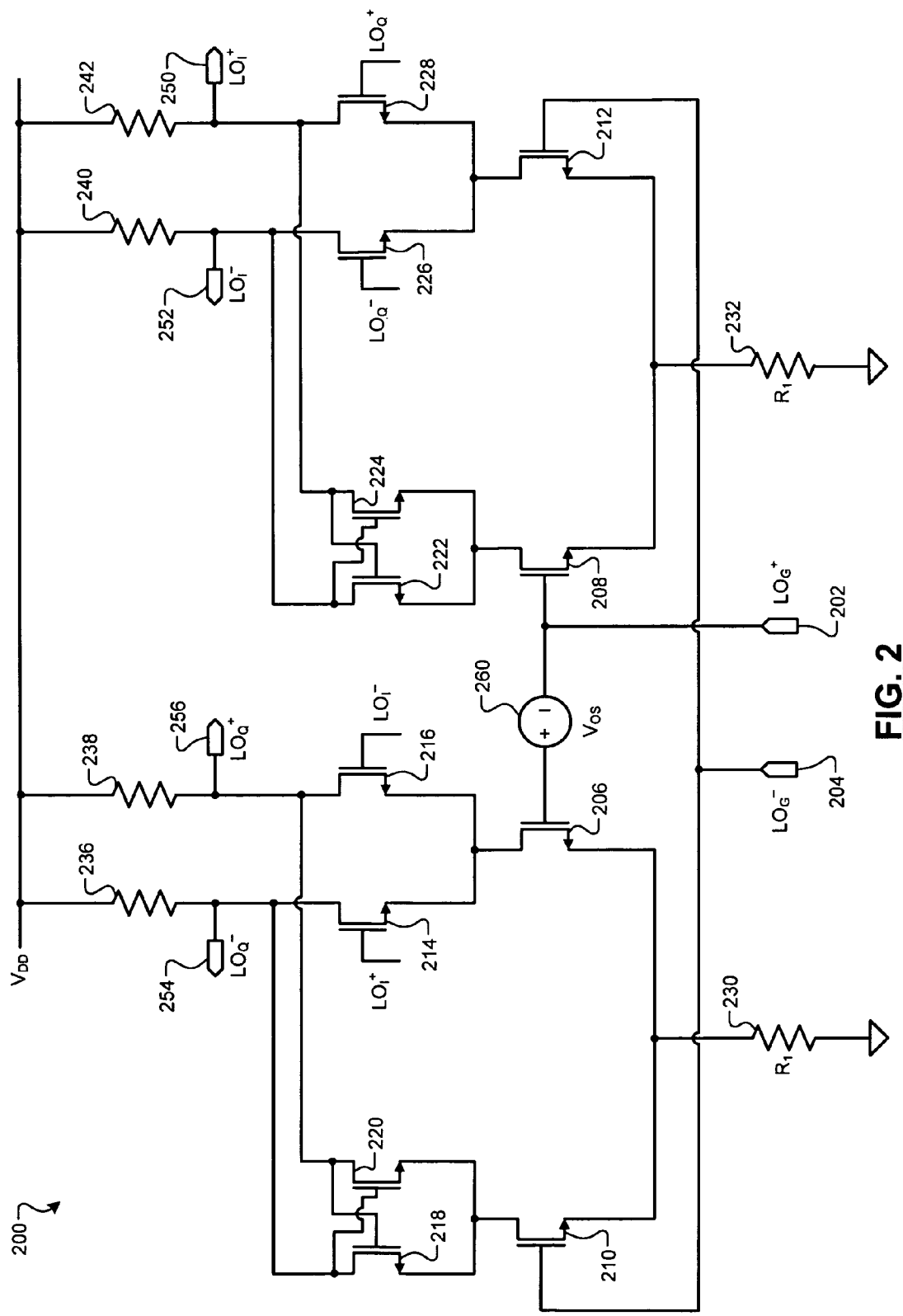
FIG. 2 is a functional schematic of a frequency divider according to the prior art.
Figure 5A:
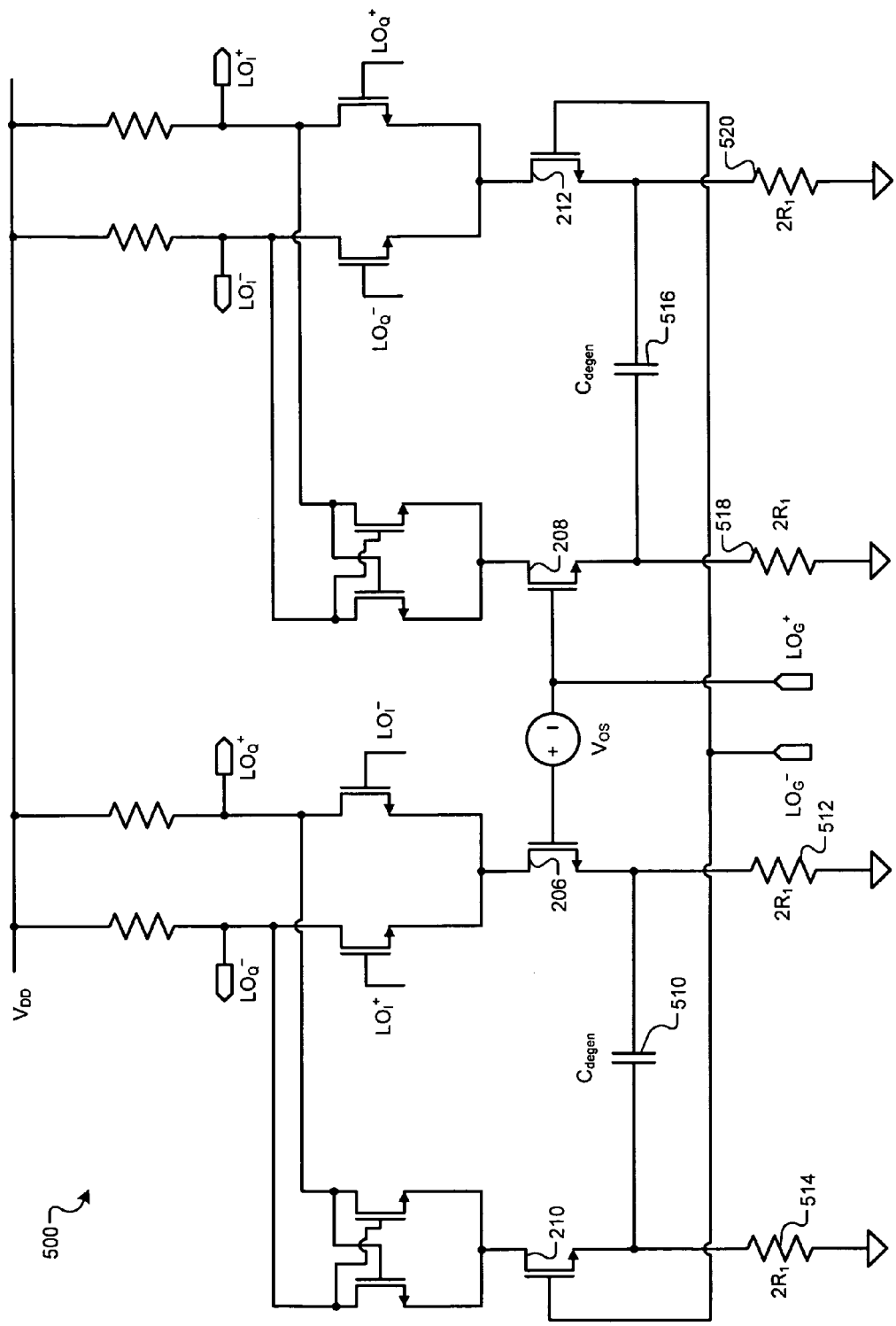
FIG. 5A is a functional schematic of an exemplary frequency divider according to the principles of the present disclosure.

Referring now to FIG. 5A, a functional schematic of an exemplary frequency divider 500, such as the frequency divider 408 of FIG. 4, according to the principles of the present disclosure is presented. For purposes of clarity, reference numerals from FIG. 2 are used to identify similar components. The frequency divider 500 includes first, second, third, and fourth transistors 206, 208, 210, and 212.

In various implementations, the first, second, third, and fourth transistors 206, 208, 210, and 212 are metal oxide semiconductor field effect transistors (MOSFETs) that have gates, sources, and drains, although other transistor types may be used. The sources of the first and third transistors 206 and 210 are connected via a first degeneration capacitor 510. The capacitance value of the first degeneration capacitor 510 is chosen so that the sources of the first and third transistors 206 and 210 will effectively be connected at the operating frequency of interest of the frequency divider 500.

The source of the first transistor 206 communicates with a first terminal of a first resistance 512. The source of the third transistor 210 communicates with a first terminal of a second resistance 514. Opposite terminals of the first and second resistances 512 and 514 communicate with ground. The resistance values of the first and second resistances 512 and 514 are chosen to be twice the value of $R_1$ so that in parallel the total resistance will be approximately the same ($R_1$) as the first resistance 230 of FIG. 2.

The sources of the second and fourth transistors 208 and 212 are connected via a second degeneration capacitor 516, having a capacitance value equal to that of the first degeneration capacitor 510. The sources of the second and fourth transistors communicate with first terminals of third and fourth resistances 518 and 520, respectively.

Opposite terminals of the third and fourth resistances 518 and 520 communicate with ground. The resistance values of the third and fourth resistances 518 and 520 are approximately equal to those of the first and second resistances 512 and 514. The DC current imbalance between the first and third transistors 206 and 210 (input pair) can now be written as:

$$\Delta I_{DC,new} = I_{1Q} - I_{2Q} \approx \frac{g_m}{1 + 2g_m R_1} \cdot V_{OS},$$

where $g_m$ is the small signal transconductance of the input pair with an offset voltage $V_{OS}$ equal to zero, and $I_{1Q}$ and $I_{2Q}$ are the currents flowing through the first and third transistors 206 and 210, respectively.

Using the frequency divider 500, $\Delta I_{DC}$ is attenuated by a factor of $1+2g_m R_1$ as compared to the frequency divider 200 of FIG. 2. Even though the first and second resistances 512 and 514 may have some mismatch, they are generally much better matched than the first and third transistors 206 and 210, and therefore contribute less to the current mismatch. Simulation with a resistance value $R_1$ of 200Ω and $g_m$ of 5.5 mS shows that phase mismatch has improved from 3.9° in the frequency divider 200 of FIG. 2 to 1.9° in the frequency divider 500 of FIG. 5A, even assuming a 2% resistor mismatch. A phase mismatch improvement this substantial may eliminate the need for a baseband IQ calibration scheme.

Figure 5B:
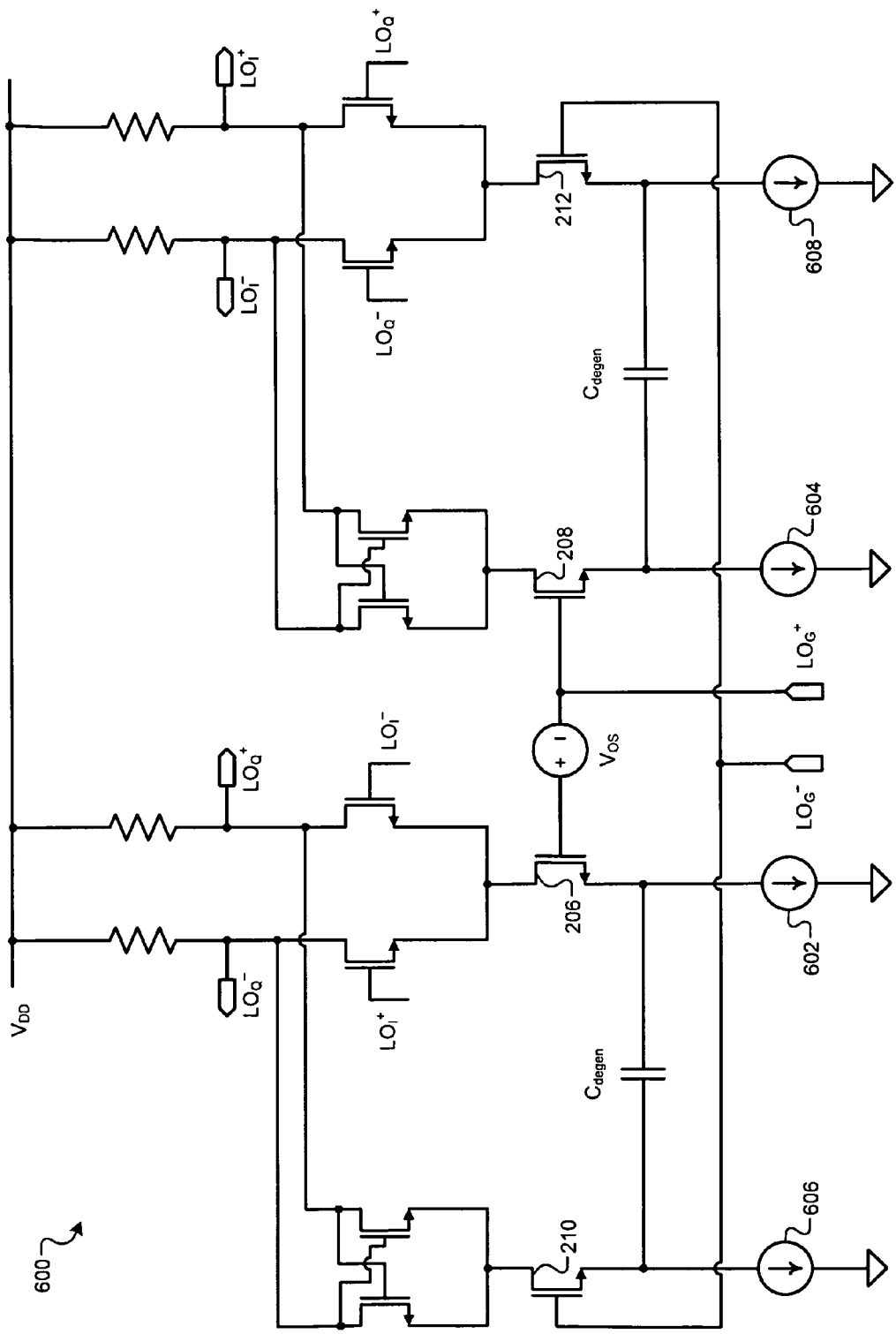
FIG. 5B is a functional schematic of another exemplary frequency divider according to the principles of the present disclosure.

Referring now to FIG. 5B, a functional schematic of another exemplary frequency divider 600 according to the principles of the present disclosure is presented. For purposes of clarity, reference numerals from FIG. 5A are used to identify similar components. The alternative frequency divider 600 includes first, second, third, and fourth transistors 206, 208, 210, and 212.

In various implementations, the first, second, third, and fourth transistors 206, 208, 210, and 212 are metal oxide semiconductor field effect transistors (MOSFETs) that have gates, sources, and drains, although other transistor types may be used. The sources of the first, second, third, and fourth transistors 206, 208, 210, and 212 communicate with first, second, third, and fourth current sources 602, 604, 606, and 608. Opposite terminals of the first, second, third, and fourth current sources 602, 604, 606, and 608 communicate with ground.

In the frequency divider 500 of FIG. 5A, current mismatch can be improved by increasing the value of $R_1$. However, there is a practical limit; as the value of $R_1$ increases, the voltage drop across $R_1$ also increases, thus reducing the output swing. The current sources 602, 604, 606, and 608 of the alternative frequency divider 600 effectively allow the resistance value to increase while maintaining a high output swing. Current source mismatch is now the main contribution to IQ phase mismatch. However, since the current sources are not in the signal path, they can be made large for precise current matching.

Figure 3:
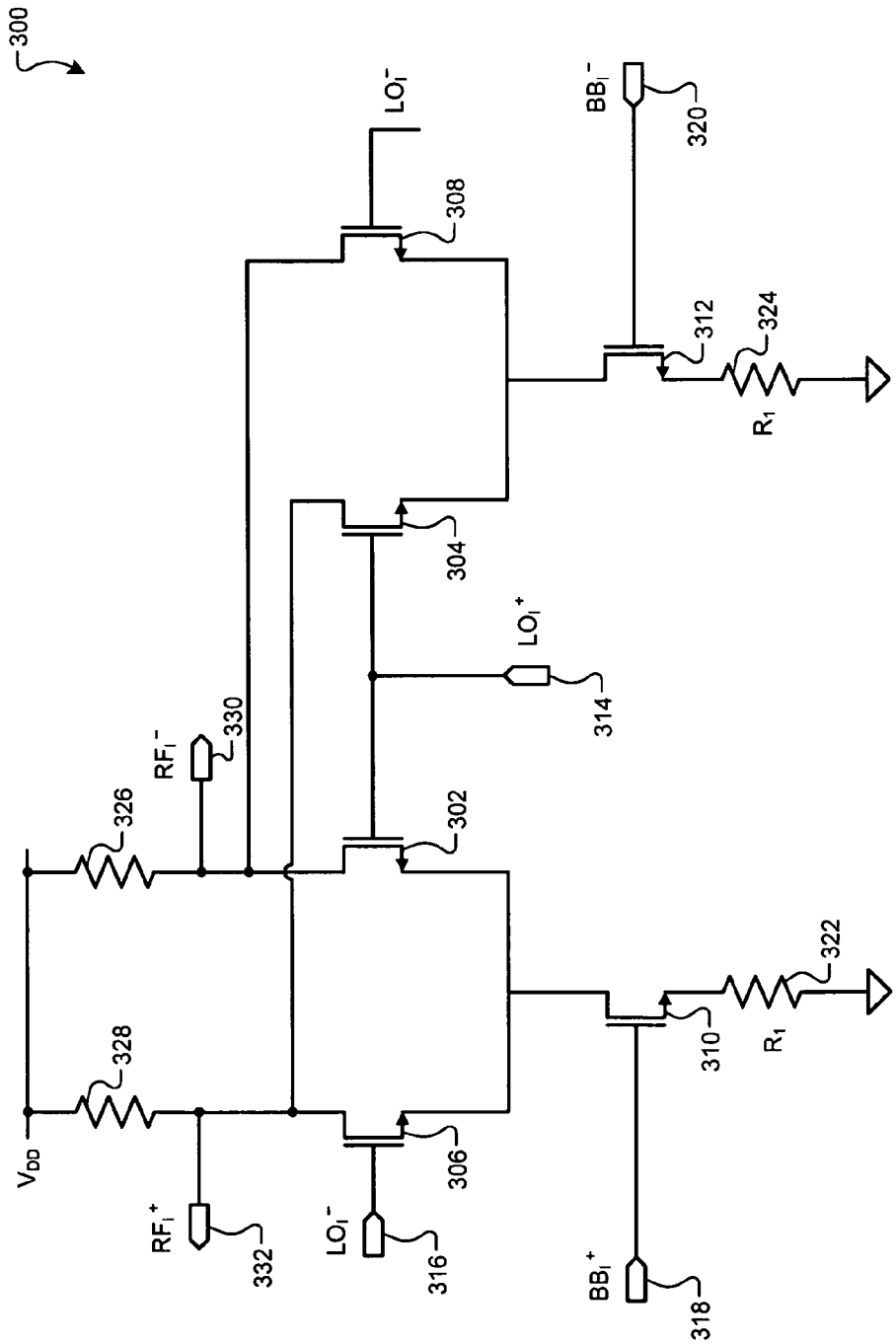
FIG. 3 is a functional schematic of a mixer according to the prior art.
Figure 6A:
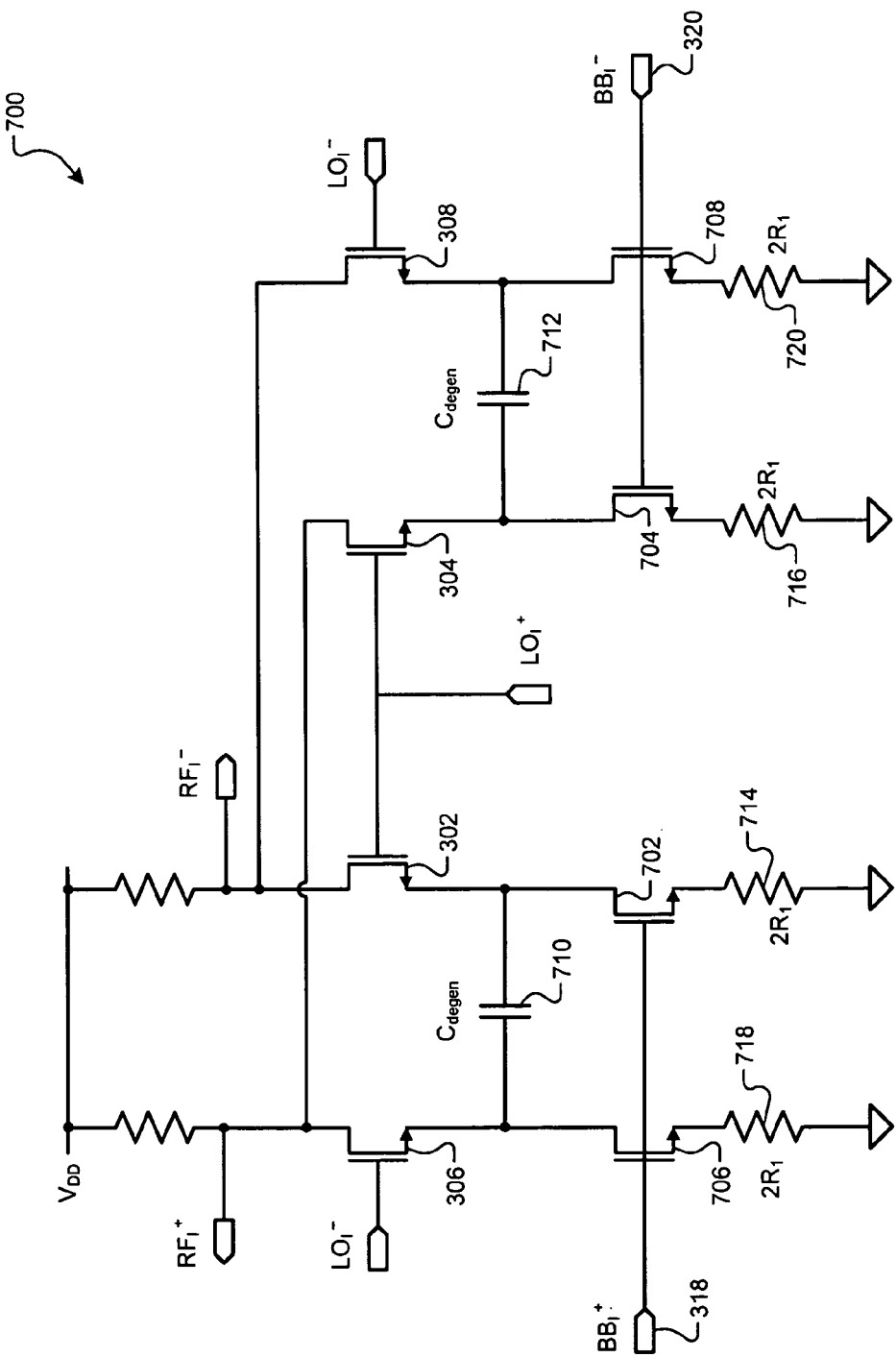
FIG. 6A is a functional schematic of an exemplary mixer according to the principles of the present disclosure.

Referring now to FIG. 6A, a functional schematic of an exemplary mixer 700, such as the mixers 404 and 406 of FIG. 4, according to the principles of the present disclosure is presented. For purposes of clarity, reference numerals from FIG. 3 are used to identify similar components. The mixer 700 includes first, second, third, fourth, fifth, sixth, seventh, and eighth transistors 302, 304, 306, 308, 702, 704, 706, and 708.

In various implementations, the first, second, third, fourth, fifth, sixth, seventh, and eighth transistors 302, 304, 306, 308, 702, 704, 706, and 708 are metal oxide semiconductor field effect transistors (MOSFETs) that have gates, sources, and drains, although other transistor types may be used. The source of the first transistor 302 communicates with the drain of the fifth transistor 702 and with a first terminal of a first degeneration capacitor 710.

An opposite terminal of the first degeneration capacitor 710 communicates with the source of the third transistor 306 and the drain of the seventh transistor 706. The source of the second transistor 304 communicates with the drain of the sixth transistor 704 and also with a first terminal of a second degeneration capacitor 712.

An opposite terminal of the second degeneration capacitor 712 communicates with the source of the fourth transistor 308 and the drain of the eighth transistor 708. The gates of the fifth and seven transistors 702 and 706 receive a $BS_I^+$ signal 318. The gates of the sixth and eighth transistors 704 and 708 receive a $BB_I^-$ signal 320. The sources of the fifth, sixth, seventh, and eighth transistors 702, 704, 706, and 708 communicate with first terminals of first, second, third, and fourth resistances 714, 716, 718, and 720, respectively.

Opposite terminals of the first, second, third, and fourth resistances 714, 716, 718, and 720 communicate with ground. The resistance values of the first, second, third, and fourth resistances 714, 716, 718, and 720 are approximately equal to two times $R_1$. The mixer 700 improves upon the mixer 300 of FIG. 3 by decreasing the current mismatch between the first and third transistors 302 and 306, and between the second and fourth transistors 304 and 308. This in turn leads to better phase matching of the $RF_I$ output.

Figure 6B:
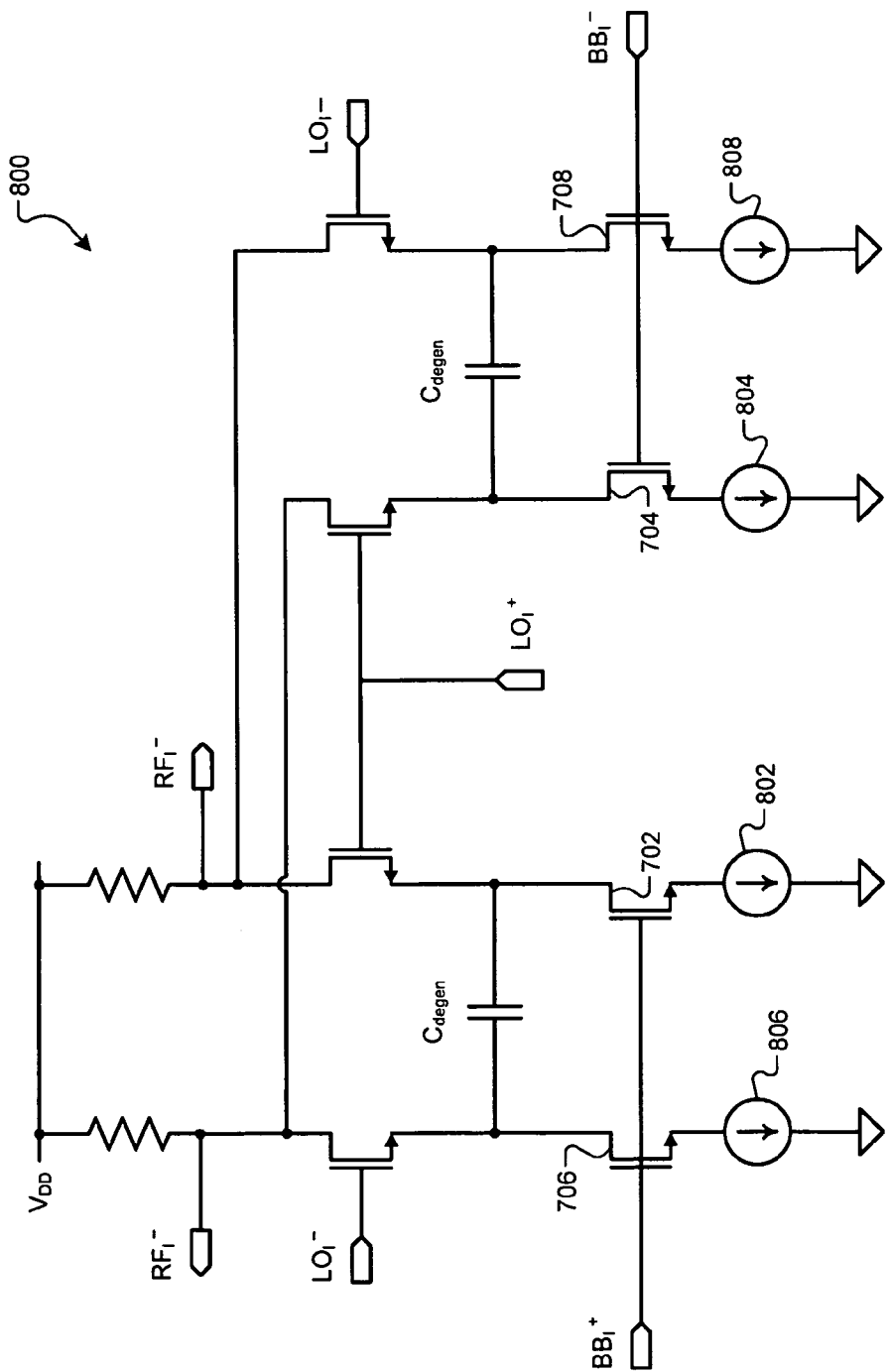
FIG. 6B is a functional schematic of another exemplary mixer according to the principles of the present disclosure.

Referring now to FIG. 6B, a functional schematic of another exemplary mixer 800 according to the principles of the present disclosure is presented. For purposes of clarity, reference numerals from FIG. 6A will be used to identify similar components. The alternative mixer 800 includes first, second, third, and fourth transistors 702, 704, 706, and 708. In various implementations, the first, second, third, and fourth transistors 702, 704, 706, and 708 are metal oxide semiconductor field effect transistors (MOSFETs) that have gates, sources, and drains, although other transistor types may be used.

The sources of the first, second, third, and fourth transistors 702, 704, 706, and 708 communicate with first terminals of current sources 802, 804, 806, and 808, respectively. Opposite terminals of the current sources 802, 804, 806, and 808 communicate with ground. For similar reasons as in FIG. 5B, the current sources 802, 804, 806, and 808 improve the phase match performance of the alternative mixer 800.

Figure 7B:
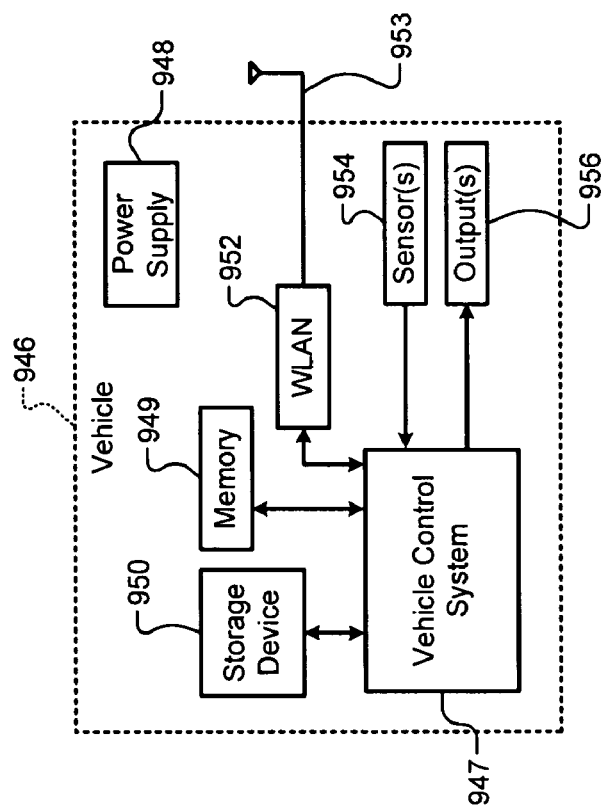
FIG. 7B is a functional block diagram of a vehicle control system.
Figure 7A:
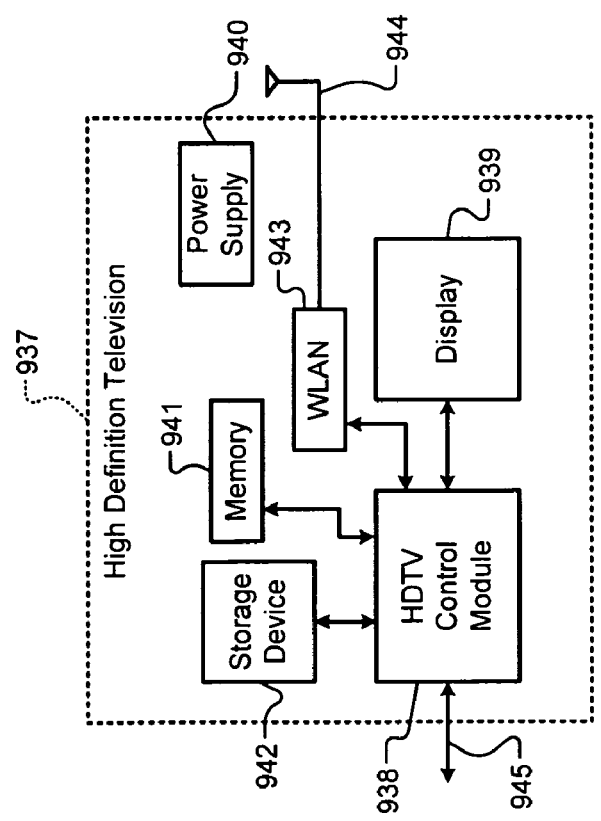
FIG. 7A is a functional block diagram of a high definition television.

Referring now to FIGS. 7A-7E, various exemplary implementations incorporating the teachings of the present disclosure are shown. Referring now to FIG. 7A, the teachings of the disclosure can be implemented in a WLAN interface 943 of a high definition television (HDTV) 937. The HDTV 937 includes a HDTV control module 938, a display 939, a power supply 940, memory 941, a storage device 942, the WLAN interface 943 and associated antenna 944, and an external interface 945.

The HDTV 937 can receive input signals from the WLAN interface 943 and/or the external interface 945, which sends and receives information via cable, broadband Internet, and/or satellite. The HDTV control module 938 may process the input signals, including encoding, decoding, filtering, and/or formatting, and generate output signals. The output signals may be communicated to one or more of the display 939, memory 941, the storage device 942, the WLAN interface 943, and the external interface 945.

Memory 941 may include random access memory (RAM) and/or nonvolatile memory such as flash memory, phase change memory, or multi-state memory, in which each memory cell has more than two states. The storage device 942 may include an optical storage drive, such as a DVD drive, and/or a hard disk drive (HDD). The HDTV control module 938 communicates externally via the WLAN interface 943 and/or the external interface 945. The power supply 940 provides power to the components of the HDTV 937.

Referring now to FIG. 7B, the teachings of the disclosure may be implemented in a WLAN interface 952 of a vehicle 946. The vehicle 946 may include a vehicle control system 947, a power supply 948, memory 949, a storage device 950, and the WLAN interface 952 and associated antenna 953. The vehicle control system 947 may be a powertrain control system, a body control system, an entertainment control system, an anti-lock braking system (ABS), a navigation system, a telemetric system, a lane departure system, an adaptive cruise control system, etc.

The vehicle control system 947 may communicate with one or more sensors 954 and generate one or more output signals 956. The sensors 954 may include temperature sensors, acceleration sensors, pressure sensors, rotational sensors, airflow sensors, etc. The output signals 956 may control engine operating parameters, transmission operating parameters, suspension parameters, etc.

The power supply 948 provides power to the components of the vehicle 946. The vehicle control system 947 may store data in memory 949 and/or the storage device 950. Memory 949 may include random access memory (RAM) and/or nonvolatile memory such as flash memory, phase change memory, or multi-state memory, in which each memory cell has more than two states. The storage device 950 may include an optical storage drive, such as a DVD drive, and/or a hard disk drive (HDD). The vehicle control system 947 may communicate externally using the WLAN interface 952.

Figure 7D:
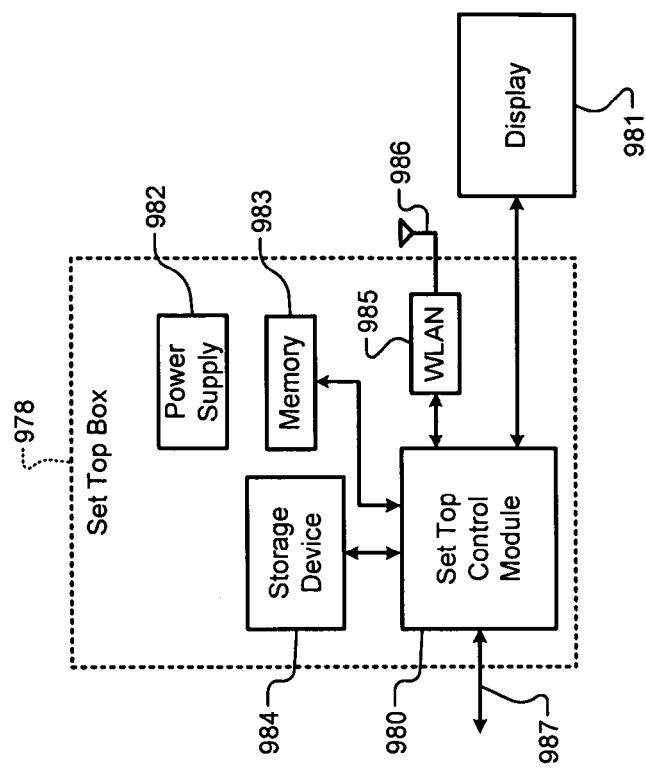
FIG. 7D is a functional block diagram of a set top box.
Figure 7C:
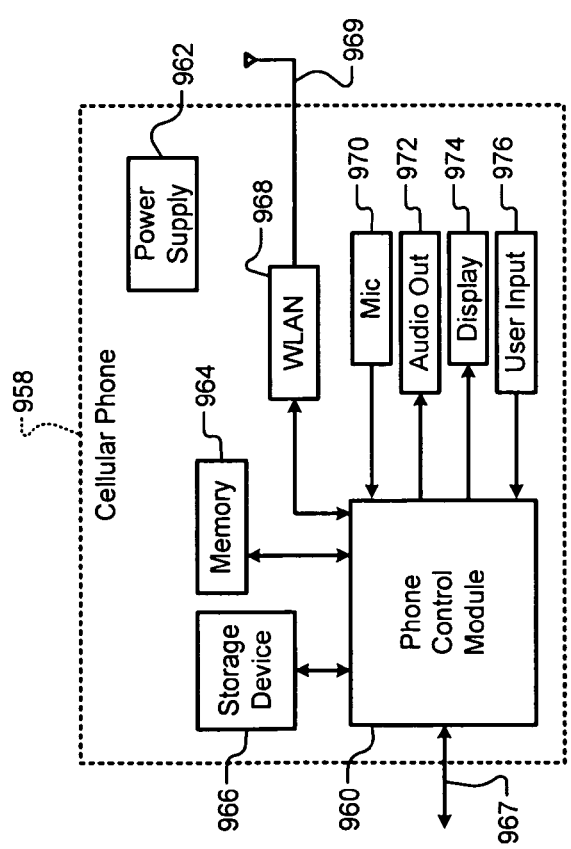
FIG. 7C is a functional block diagram of a cellular phone.

Referring now to FIG. 7C, the teachings of the disclosure can be implemented in a WLAN interface 968 of a cellular phone 958. The cellular phone 958 includes a phone control module 960, a power supply 962, memory 964, a storage device 966, and a cellular network interface 967. The cellular phone 958 may include the WLAN interface 968 and associated antenna 969, a microphone 970, an audio output 972 such as a speaker and/or output jack, a display 974, and a user input device 976 such as a keypad and/or pointing device.

The phone control module 960 may receive input signals from the cellular network interface 967, the WLAN interface 968, the microphone 970, and/or the user input device 976. The phone control module 960 may process signals, including encoding, decoding, filtering, and/or formatting, and generate output signals. The output signals may be communicated to one or more of memory 964, the storage device 966, the cellular network interface 967, the WLAN interface 968, and the audio output 972.

Memory 964 may include random access memory (RAM) and/or nonvolatile memory such as flash memory, phase change memory, or multi-state memory, in which each memory cell has more than two states. The storage device 966 may include an optical storage drive, such as a DVD drive, and/or a hard disk drive (HDD). The power supply 962 provides power to the components of the cellular phone 958.

Referring now to FIG. 7D, the teachings of the disclosure can be implemented in a WLAN interface 985 of a set top box 978. The set top box 978 includes a set top control module 980, a display 981, a power supply 982, memory 983, a storage device 984, and the WLAN interface 985 and associated antenna 986.

The set top control module 980 may receive input signals from the WLAN interface 985 and an external interface 987, which can send and receive information via cable, broadband Internet, and/or satellite. The set top control module 980 may process signals, including encoding, decoding, filtering, and/or formatting, and generate output signals. The output signals may include audio and/or video signals in standard and/or high definition formats. The output signals may be communicated to the WLAN interface 985 and/or to the display 981. The display 981 may include a television, a projector, and/or a monitor.

The power supply 982 provides power to the components of the set top box 978. Memory 983 may include random access memory (RAM) and/or nonvolatile memory such as flash memory, phase change memory, or multi-state memory, in which each memory cell has more than two states. The storage device 984 may include an optical storage drive, such as a DVD drive, and/or a hard disk drive (HDD).

Figure 7E:
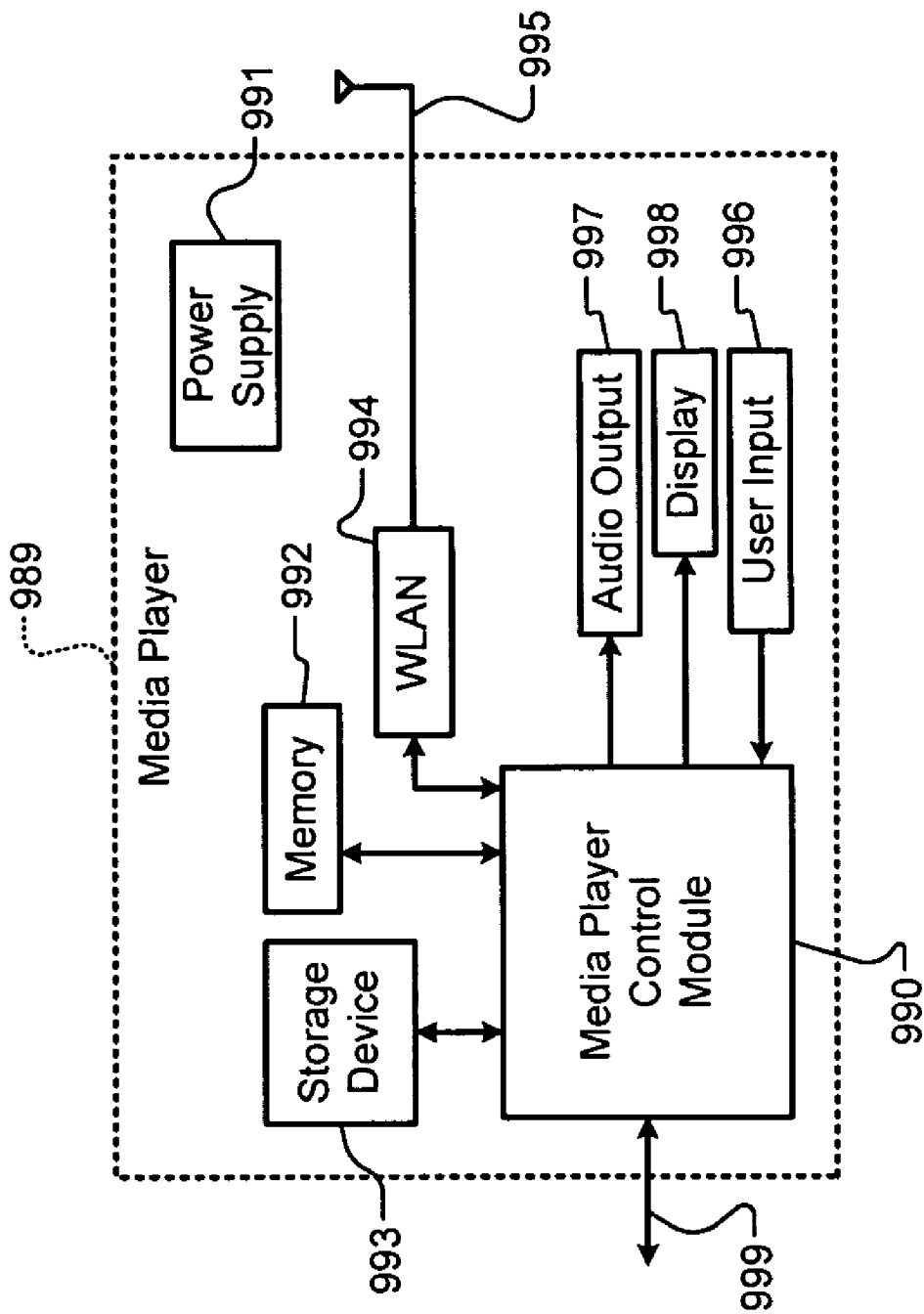
FIG. 7E is a functional block diagram of a media player.

Referring now to FIG. 7E, the teachings of the disclosure can be implemented in a WLAN interface 994 of a media player 989. The media player 989 may include a media player control module 990, a power supply 991, memory 992, a storage device 993, the WLAN interface 994 and associated antenna 995, and an external interface 999.

The media player control module 990 may receive input signals from the WLAN interface 994 and/or the external interface 999. The external interface 999 may include USB, infrared, and/or Ethernet. The input signals may include compressed audio and/or video, and may be compliant with the MP3 format. Additionally, the media player control module 990 may receive input from a user input 996 such as a keypad, touchpad, or individual buttons. The media player control module 990 may process input signals, including encoding, decoding, filtering, and/or formatting, and generate output signals.

The media player control module 990 may output audio signals to an audio output 997 and video signals to a display 998. The audio output 997 may include a speaker and/or an output jack. The display 998 may present a graphical user interface, which may include menus, icons, etc. The power supply 991 provides power to the components of the media player 989. Memory 992 may include random access memory (RAM) and/or nonvolatile memory such as flash memory, phase change memory, or multi-state memory, in which each memory cell has more than two states. The storage device 993 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A wireless transceiver comprising:
   a mixer that includes:
   a first differential input pair that includes first and second transistors, each having a control terminal that respectively receives first and second signals of a differential oscillator signal, wherein the differential oscillator signal is one of a first phase and a second phase;
   a second differential input pair that includes first and second transistors, each having a control terminal that respectively receives the first and second signals of the differential oscillator signal;
   first and second bias transistors that receive a first signal of a differential input signal, and that respectively communicate with first terminals of the first and second transistors of the first differential input pair, wherein the differential input signal is the one of the first phase and the second phase;

third and fourth bias transistors that receive a second signal of the differential input signal, and that respectively communicate with first terminals of the first and second transistors of the second differential input pair;

a first capacitive element having first and second ends that respectively communicate with the first terminals of the first and second transistors of the first differential input pair;

a second capacitive element having first and second ends that respectively communicate with the first terminals of the first and second transistors of the second differential input pair; and four current sourcing elements that respectively communicate with first terminals of the first, second, third, and fourth bias transistors; and a frequency divider that provides the differential oscillator signal, wherein the frequency divider includes:

a first frequency divider differential input pair;

a second frequency divider differential input pair; and a circuit that communicates with second terminals of the first and second transistors of the first and second frequency divider differential input pairs, and that outputs first and second signals of a differential first phase signal and first and second signals of a differential second phase signal, wherein the differential first phase signal and the differential second phase signal have a phase difference of ninety degrees, wherein the differential oscillator signal is one of the differential first phase signal and the differential second phase signal.

2. The wireless transceiver of claim 1, wherein second terminals of the first transistors of the first and second differential input pairs communicate together to output a first signal of a differential output signal that is the one of the first phase and the second phase, and wherein the second terminals of the second transistors of the first and second differential input pairs communicate together to output a second signal of the differential output signal.

3. The wireless transceiver of claim 2, wherein the second terminals of the first transistors of the first and second differential input pairs communicate with a first loading device, and wherein the second terminals of the second transistors of the first and second differential input pairs communicate with a second loading device.

4. The wireless transceiver of claim 3, wherein the first and second loading devices comprise resistors that communicate with a supply potential.

5. The wireless transceiver of claim 1, wherein the first and second transistors of the first and second differential input pairs and the first, second, third, and fourth bias transistors are metal oxide semiconductor field effect transistors (MOSFETs), wherein each MOSFET has (i) a source, (ii) a drain, and (iii) a gate, wherein the source serves as the first terminal, the drain serves as the second terminal, and the gate serves as the control terminal.

6. The wireless transceiver of claim 1, wherein the four current sourcing elements comprise resistors.

7. The wireless transceiver of claim 6, wherein the four current sourcing elements communicate with a ground potential.

8. The wireless transceiver of claim 1, wherein the four current sourcing elements comprise current sources.

9. The wireless transceiver of claim 1, wherein the first phase and the second phase comprise in-phase and quadrature, respectively.

10. The wireless transceiver of claim 1, wherein:

the first frequency divider differential input pair includes first and second transistors, each having a control terminal that respectively receives first and second signals of a differential local oscillator signal;

the second frequency divider differential input pair includes first and second transistors, each having a control terminal that respectively receives the first and second signals of the differential local oscillator signal; and the frequency divider further includes:

a third capacitive element having first and second ends that respectively communicate with first terminals of the first and second transistors of the first frequency divider differential input pair;

a fourth capacitive element having first and second ends that respectively communicate with first terminals of the first and second transistors of the second frequency divider differential input pair; and four current sourcing elements that respectively communicate with the first terminals of the first and second transistors of the first and second frequency divider differential input pairs.

* * * * *